SEMICONDUCTOR DEVICE AND APPARATUS

Filed Jan. 19, 1953 2 Sheets-Sheet 1

Inventor:
Israel Arnold Lesk,
by Charles M. Hutchins
His Attorney.

Aug. 25, 1959 I. A. LESK 2,901,554

SEMICONDUCTOR DEVICE AND APPARATUS

Filed Jan. 19, 1953 2 Sheets-Sheet 2

Inventor:
Israel Arnold Lesk,
by Charles M. Hutchins
His Attorney.

United States Patent Office 2,901,554 Patented Aug. 25, 1959

2,901,554

SEMICONDUCTOR DEVICE AND APPARATUS

Israel Arnold Lesk, Syracuse, N.Y., assignor to General Electric Company, a corporation of New York Application January 19, 1953, Serial No. 331,947

19 Claims. (Cl. 179—171)

This invention relates to semiconductor devices that may be constructed so as to exhibit different desired characteristics.

The theory of operation of semiconductor devices is well understood by those skilled in the art and, therefore, only as much of the theory as is necessary for the understanding of the present invention will be set forth herein. A semiconductor material having a number of electrons in excess of those required by the covalent interatomic bonds is known as N-type, as current is principally carried by the excess electrons. A semiconductor material having less electrons than those required for the covalent interatomic bonds is known as P-type as the current is principally carried by the shift of the position of these deficiencies. Holes are actually deficiencies of electrons, but behave in many respects as though they were electrons with a positive charge. Hence the P and N semiconductor materials may be described as being predominantly opposite or different carrier types. By more rigorous definition, N-type semiconductor material has an electron density that exceeds the number of holes and P-type semiconductor material has a hole density that exceeds the electron density.

If a sufficiently thin section of semiconductor material of one carrier type is interposed between two layers of semiconductor material of the opposite carrier type, and if there is such intimate contact between the different semiconductor materials as to form what is known as P–N or rectifying junctions, such an arrangement is capable of amplifying signals. Thus, the device may be comprised of two bits of P-type semiconductor material separated by semiconductor of the N-type in which case it is a P–N–P type of amplifier. An ohmic connection is made to the N-type material, and is termed the base electrode. One bit of P-type semiconductor material is biased positively with respect to the base electrode and is known as an emitter. In a P–N–P device the emitter is considered to introduce holes into the N-type region. The other bit of P-type semiconductor is biased negatively with respect to the base electrode and is known as a collector as the holes introduced by the emitter flow to it. The types of semiconductor material can be reversed so as to produce a N–P–N semiconductor amplifying device. In this latter arrangement the N-type material on one side is biased negatively with respect to the base electrode so as to act as an emitter and injects electrons into the P-type material. The N-type material on the other side of the P-type material is biased positively with respect to the base electrode so as to collect the electrons.

In the present state of the art there are two different ways of making either the N–P–N or P–N–P semiconductor device. In one method a seed crystal is immersed in a molten mass of semiconductor material and a bar of semiconductor material is formed by withdrawing the seed crystal. As the seed crystal is withdrawn, suitable materials are added to the molten mass so that the semiconductor material in the bar can be either P or N-type. A semiconductor device made in this manner is generally referred to as the grown type as it is made by growing a crystalline structure onto a seed crystal. Another way of making semiconductor devices is to place a body or dot of impurity on a body of semiconductor material subjecting the body and impurity to an elevated temperature to fuse or diffuse the impurity into the germanium. For example, a small amount of indium can be brought into contact with a desired point on a body of N-type semiconductor material and the temperature raised to produce an island or area of P-type germanium on the N-type body and separated therefrom by a rectifying or P–N junction. Another spot of indium can be applied in a similar manner to the other side of the germanium so as to produce a P–N–P semiconductor device. Semiconductor devices made in this manner are known as diffused impurity or fused dot type. A method of preparing devices of this type is described in detail and claimed in copending application, Serial No. 187,490, filed September 29, 1950, now abandoned, by William C. Dunlap, Jr., and assigned to the assignee of this application.

Whether the semiconductor device is of the grown type or the fused dot type, it has been customary to use only three electrodes. In a P–N–P semiconductor device, for example, an emitter electrode is placed in contact with one mass of P-type material, a collector electrode is placed in contact with the other mass of P-type material and a single base electrode is placed in contact with the N-type material. Suitable voltages, supplied by various sources, are then applied between the electrodes via circuits having desired impedances. The operating point of such a device may be defined as the point at which a given emitter current and collector voltage exists or vice versa. On the other hand the operating point may be defined by fixing any two of the four parameters emitter current, emitter voltage, collector current and collector voltage. Changes in the current gain $\alpha$, which has been defined as the ratio between a change in collector current to a corresponding change in emitter current, can be produced by altering the operating point. A change in operating point and hence a change in $\alpha$ is effected by changing the voltages provided by the sources, by varying the impedances of the circuits involved, or by a combination of these methods. However, in many applications it is desirable that the change in $\alpha$ be brought about in response to a desired voltage without varying the operating point.

Accordingly it is an object of this invention to provide an improved semiconductor device of such nature that a change in the current gain $\alpha$ can, if desired, be brought about at a fixed operating point in response to a desired voltage.

Furthermore, in semiconductor devices of the type described above, the manner in which the current gain $\alpha$ changes, as a function of the applied voltages that determine the operating point, is limited.

Therefore, it is another object of this invention to provide an improved semiconductor device of such nature that the change in the current gain $\alpha$ with variation in a given voltage applied, to the device can be effected in a novel manner without a change in the operating point.

It has been found in practice that the current gain $\alpha$, that has been defined above as the ratio between the change in output current at the collector to the change in input current at the emitter, falls off to a relatively low value when the voltage applied to the emitter varies at a relatively low rate.

Another object of the present invention, therefore, is to provide an improved semiconductor amplifier wherein the frequency at which the current gain decreases to any appreciable extent is increased.

In semiconductor amplifiers, the resistance of the base is often common to the input and output circuits and the amount of feedback from the output to input circuits increases with the value of this resistance.

Accordingly, it is another object of this invention to provide an improved semiconductor amplifier whereby the amount of feedback from the output to the input circuits is reduced.

It is a further object of the invention to increase the power gain of a semiconductor device at high frequencies. Generally, the power gain increases with $\alpha$ and decreases with the base resistance $r_b$.

In normal three electrode semiconductor devices, having an emitter, a collector and a base electrode, the resistance $r_b$ has in many cases a rather large value at the operating point where the current gain $\alpha$ is a maximum, thus providing a large amount of feedback at the operating point of maximum gain.

In accordance with another object of this invention, an improved semiconductor device is provided having an operating point at which the current gain $\alpha$ is a maximum and the base resistance $r_b$ is relatively small so that maximum gain is acquired with minimum feedback.

It is another object of the present invention to provide a semiconductor apparatus that can be used to switch an input signal applied to an emitter to a selected one of a plurality of collector electrodes or vice versa under the control of a switching voltage.

Another object of the present invention is to provide an improved semiconductor apparatus that operates as a push-pull amplifier.

In attaining these objectives, means are provided for establishing different electrostatic potentials at different portions of at least one of the junctions formed by the semiconductor materials of different types. In other words an electric field is established that is transverse to the junction. One way of establishing such a field is to provide another base electrode and apply a suitable voltage between it and the other base electrode. Variations in this voltage produce a change in the current gain $\alpha$ independently of the operating point.

The manner in which the current gain $\alpha$ changes in response to changes in the voltage applied between the base electrodes can be determined by the relative sizes and locations of the emitter or emitters and the collector or collectors. With a plurality of emitters or collectors having a particular geometric relationship the semiconductor device can be made to operate as a switch or as a push-pull amplifier. The required configurations of the electrodes can be effected by cutting away various portions of semiconductor devices of the grown type, but this is difficult to do. However, it is comparatively easy to fabricate semiconductor devices of the fused dot type having a desired electrode configuration.

Ways in which these and other objects and advantages of the present invention may be attained will be more readily apparent after a detailed consideration of the drawings in which.

Figure 1:
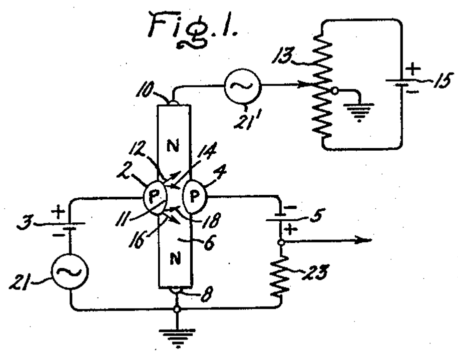
Figure 1 illustrates a semiconductor device having an emitter and collector of equal size as well as a pair of base electrodes for establishing the required transverse electrostatic field.

Figure 1 shows a semiconductor amplifier of the fused dot P–N–P type wherein a P-type emitter 2 that is positively biased by a battery 3 with respect to base 8 and a P-type collector 4 that is negatively biased by a battery 5 with respect to base 8 are of approximately equal size and fused to a body 6 of N-type semiconductor material substantially opposite one another. A grounded base electrode 8 in this illustrative example, makes an ohmic contact with the body 6 at its lower end and in order to effect control of the gain characteristics in accordance with the principles of this invention, another base electrode 10 makes an ohmic contact with the body 6 at its upper end. Omitting, for the time being, the effects produced by the application of potential to the base electrode 10, and therefore, assuming the operating conditions prevailing in a three electrode semiconductor device of a type known to those skilled in the art, the semiconductor device operates as follows: Positive carriers or holes injected into the base material 6 at any point of the surface of demarcation 11 of the emitter 2 fan out in divergent paths as the electrostatic field between the emitter and collector is generally not of sufficient magnitude to focus them into a beam. For example, some carriers emerging from the top of the emitter 2 may follow a path indicated by the arrow 12 and other carriers may follow a path indicated by the arrow 14. The positive carriers or holes following the path 12 are absorbed in the N-type material of the body 6 and so do not reach the collector 4. Most of the carriers following the path 14 do reach the collector 4. In a similar way the carriers emerging from a point at the lower end of the emitter 2 along a path 16 are absorbed in the N-type material of the body 6 and most of those carriers following the path 18 reach the collector 4. The current gain $\alpha$ is the ratio of the increment of collector current to the increment of emitter current and $\alpha$ in this particular semiconductor device is usually less than unity as some of the emitted carriers are absorbed in the N-type material of the body 6. Other factors generally prevent $\alpha$ from attaining a value of unity for reasons well known to those skilled in the art. Some of the carriers flow to the base electrode 8, and others are absorbed by the base material even though they follow paths like 14 and 18. It should be borne in mind that if the width of body 6 between contacts 2 and 4 is thin enough, most of the carriers emerging from the more central portion of the surface of the emitter reach the collector.

The effect of applying voltages of varying magnitudes and polarities to the base electrode 10 by means of potentiometer 13 and its associated battery 15, in accordance with the principles of this invention is as follows: If the voltage applied to the base electrode 10 is the same as that applied to the base electrode 8, herein illustrated as being ground, no electrostatic field exists between the base electrodes, and except for the fact that the base current is now divided between the base electrodes, the operation is substantially the same as it was before. Assume now that a positive voltage is applied to the base electrode 10 so that an electrostatic field that is transverse to the paths followed by the carriers is established between the base electrodes. If the base material is homogenous, equipotential planes, each representing a given increment of potential, would be uniformly distributed between the two base electrodes. However, for reasons well known to those skilled in the art, the presence of carriers in the material of the body 6 alters its resistivity so that there is a non-uniformity in the distances between such equipotential surfaces. The effect of this phenomena will be neglected in the following discussion. Another minor effect of the transverse field established by the base electrodes is that some of the positive carriers of this particular semiconductor device are deflected downward so that more of them may follow a path such as 16 and become absorbed in the N-type material of the body 6. However, in transverse fields of practicable strength, some of the positive carriers that normally followed paths such as 12 will also be deflected downward so that they are capable of reaching the collector 4. These effects are therefore seen to substantially cancel one another so that $\alpha$ is not changed in any great degree. It is not contemplated that the transverse field be so strong as to have any substantial effect on the number of carriers, if any, emerging from the more central portion of the emitter surface 11 that reach collector 4.

As the positive potential applied to the base electrode 10 is increased, the average potential of the body 6 in the vicinity of the surface of the emitter 2 becomes more and more positive so that the number of carriers emerging from the surface 11 and diffusing into the body 7 is reduced. The current gain $\alpha$ of the semi-conductor device is the ratio of a change in output current to a corresponding change in input current, usually specified at a fixed emitter current. In order to maintain this condition in the presence of the transverse field of the present invention, it will be assumed throughout the discussion that the positive potential applied to the emitter 2 is altered so as to maintain the total emitter current at a constant value. Therefore, as the potential applied to the base electrode 10 is made more positive, the positive potential applied to the emitter 2 must be gradually increased, and as the potential applied to the base electrode 10 is decreased, the positive potential applied to the emitter is decreased. Since under usual operation the emitter is driven from a relatively high impedance source, only a small change in emitter voltage is normally required to maintain a constant emitter current as the potential applied to the base electrode is varied. The collector voltage is also changed by a larger amount.

As the positive potential applied to the base electrode 10 is increased, relatively fewer carriers emerge from the upper portion of the surface 11 of the emitter than from the lower portion because the potential of the portion of the body 6 adjacent the upper portion is more positive with respect to the uniformly positive surface 11 of the emitter 2 than the portion of the body 6 adjacent the lower portion. As the area of the surface 11 that is much less effective in emitting carriers spreads out with the increase of the potential applied to the base electrode 10, so as to include the more central portions of the emitter surface, a greater percentage of the current carriers emerge from the lower portion of the emitter surface 11. Thus more and more carriers follow paths 16 and 18. This means that a progressively greater proportion of the carriers follow a path such as 16 so as to be absorbed in the body 6 and thus reduce the value of $\alpha$.

It has been stated above that the effect on the value of $\alpha$ when a slight positive potential is applied to the base 10 is small. If the principles described above are applied, the proportionate number of carriers following paths such as 12 is reduced so that $\alpha$ tends to increase. However, under the assumed conditions, only a small relative number of carriers follow the path 12 so that the loss of such carriers has a small effect. On the other hand, as the potential applied to the base electrode 10 becomes stronger, the fractional number of the total emitted carriers following paths such as 16 becomes pro- If now the potential applied to the base electrode 10 is increased in a negative direction with respect to the potential applied to the base electrode 8, the value of $\alpha$ is reduced for similar reasons. As this negative potential is increased, the tendency for the emitter to provide more carriers is compensated for by a reduction in the positive potential applied to the emitter 2 in keeping with the operation at a constant operating point. When the negative potential gradually increases through small values, the value of $\alpha$ may increase or decrease slightly as before owing to the loss of a relatively small number of carriers following paths such as 12 or the gain of a relatively small number of carriers following paths such as 16. Further increase in the value of the negative potential causes a larger and larger portion of the carriers to follow a path such as 12 with a consequent reduction in the value of $\alpha$.

Figure 5:
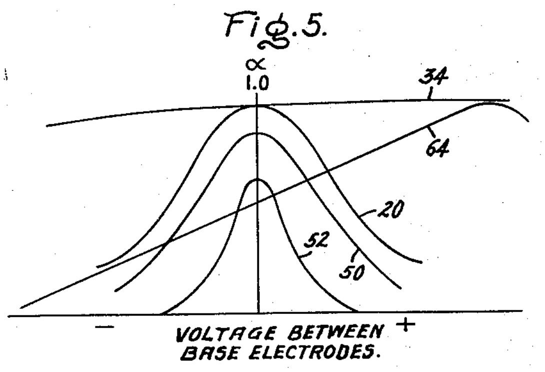
Figure 5 is comprised of graphs illustrating some of the variations of $\alpha$ with the polarity and amplitude of the voltage between the base electrodes.

A plot of the value of $\alpha$ with respect to the voltage applied to the base electrode 10 is illustrated by the graph 20 of Figure 5. Thus, for example, if the voltage between the base electrodes 8 and 10 is established by the battery 15 at any point on the curve 20, an input signal supplied by a source 21 in such manner as to be superimposed on the bias voltage provided by the battery 3 is amplified and appears across a load resistor 23 in the collector circuit. The amount of power gain depends on the value of $\alpha$ at the selected point.

Alternatively, a gain can be produced if a signal source 21' is superimposed onto the steady inter-base voltage provided by the battery 15 and the potentiometer 13 at a point on the curve 20 that is sloped. The steeper the slope, the greater the gain.

If both the signal sources 21 and 21' are used at the same time, and if the impedance of the source 21 is sufficiently low to permit the signals provided by it to change the emitter current, then the apparatus can be used as a multiplier or modulator. This is because one signal controls the number of carriers that could possibly reach the collector and the other controls the number of emitted carriers that actually reach the collector.

The principles described above have been discussed in connection with a fused dot type of semiconductor amplifier device, but they apply equally well to a semiconducting amplifier of the grown crystal type. The operation differs in that more of the carriers that do not reach the collector flow directly to the base electrodes instead of being absorbed in the body 6. In discussing the principal effects of the transverse field, a P–N–P type semiconductor amplifier has been illustrated. However, the operation is essentially the same for an N–P–N type of semiconductor amplifier if the polarities of the various voltages are reversed.

Figure 2:
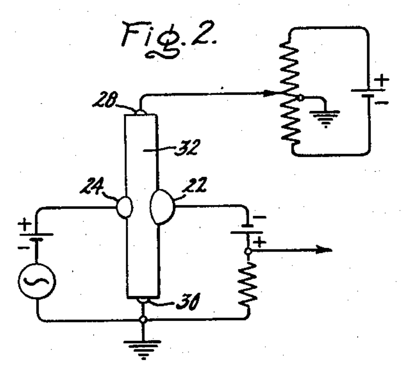
Figure 2 illustrates a semiconductor device similar to the one shown in Figure 1 except that the emitter is smaller than the collector.

The application of the principle of the transverse field to semiconductor devices having different physical configurations produces gain characteristics and operational advantages not easily attained with the grown type of semiconductor amplifier. The various devices to be discussed all operate in connection with a circuit like that of Figure 1, and therefore, the circuit will not be further discussed. In Figure 2, the collector 22 is larger than the emitter 24 so that regardless of the field set up by base electrodes 28 and 30 and hence regardless of the portion of the emitter surface supplying carriers to the interposed body 32, a large fraction of the carriers reaches the collector. The current gain $\alpha$, therefore, remains nearly constant as indicated by the graph 34 of Figure 5.

Figure 3:
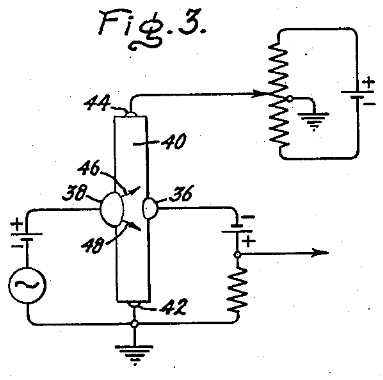
Figure 3 illustrates a semiconductor device that is similar to the one shown in Figure 1 except that the emitter is larger than the collector.

If, on the other hand, an arrangement such as that illustrated in Figure 3 is used, wherein a collector 36 is smaller than an emitter 38, $\alpha$ falls off rapidly with a change in the electric field set up in the body 40 by application of suitable voltages to base electrodes 42 and 44. This is explained by the fact that a greater percentage of the total number of carriers is emitted from the outer areas of the surface of demarcation of the emitter 38 and then follow paths such as 46 and 48 that do not terminate at the collector. These paths correspond to the paths 12 and 16 of Figure 1 as far as the qualitative effect on $\alpha$ is concerned.

As the relative size of the emitter with respect to the collector increases, the change of $\alpha$ with respect to a change in the inter-base voltage increases as indicated by the curves 50 and 52 of Figure 5.

Figure 4:
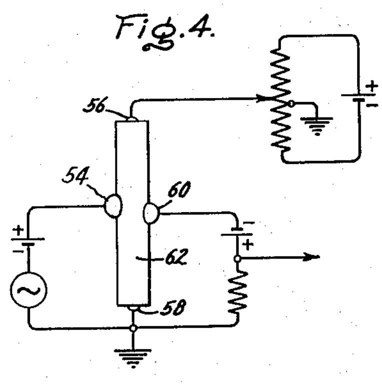
Figure 4 illustrates a semiconductor device similar to the one shown in Figure 1 except that the emitter is closer to one of the base electrodes and the collector is closer to the other.

One of the more interesting electrode configurations of a fused dot semiconductor amplifier when used with a transverse electric field is shown in Figure 4. An emitter 54 is located nearer one base electrode 56 than a base electrode 58 but a collector 60 is located on the opposite side of a body 62 at a point nearer the base electrode 58 than in the emitter. Nearly all carriers emitted from the lower portion of the emitter 54 reach the collector 60. On the other hand, a large proportion of carriers emerging from a relatively large portion of the upper portion of the emitter surface do not reach the collector. Therefore, when no transverse field exists, only a small percentage of the total current carriers reach the collector 60 as indicated by the intersection of the graph 64 of Figure 5 with the $\alpha$ axis. Assuming that the semiconductor amplifier of Figure 4 is a P–N–P type, an increase in voltage applied to the base electrode 56 in the positive direction causes an area of low emission to spread from the upper portion of the surface of the emitter 54 toward the base electrode 58. Bearing in mind that the positive potential applied to the emitter 54 is also increased so as to maintain the total emitter current at a fixed value, it will be realized, for reasons explained more fully in connection with Figure 1, that a greater and greater number of the carriers emerges from the lower portion of the emitter surface. The value of $\alpha$ increases as nearly all of the carriers emerging from the lower half of the emitter surface reach the collector. Conversely, as the voltage applied to the base electrode 56 becomes more and more negative, a larger proportion of the total number of carriers emerge from the upper portion of the surface of the emitter 54. As a greater portion of carriers emitted from this portion do not reach the collector 60, the value of $\alpha$ is reduced.

The semiconductor device of Figure 4 exhibits other advantageous properties and characteristics. For reasons well understood by those skilled in the art, a plot of the variations in the value of the resistance $r_b$ of the base electrodes 56 and 58 is often a maximum when the transverse field across the body 62 is zero or very small as illustrated in one of the graphs of Figure 6. The variations in the value of $\alpha$ are also shown and $\alpha$ has a maximum value when the base electrode 56 has a positive voltage such that many carriers that would not arrive at the collector are prevented from emanating from the upper portion of the emitter 54. Under these conditions nearly all of the carriers are emitted from the lower portion of the emitter 54 and hence reach the collector 60. Further increase in the voltage reduces the area of high emission until nearly all the carriers are emitted from the extreme lower portion of the emitter 54 where a large number of the emitted carriers do not reach the collector. A maximum $\alpha$ is thus obtained at a point where the base resistance $r_b$ has a very low value and consequently a maximum minority carrier current transfer from the emitter circuit to the collector circuit occurs with a minimum of feedback.

Figure 7:
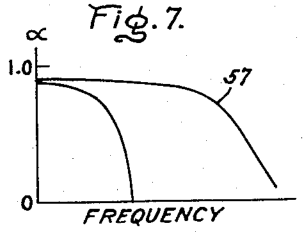
Figure 7 is a graph illustrating the variations of $\alpha$ with frequency for a known type of semiconductor device as well as for a semiconductor device such as illustrated in Figure 4.

One of the limiting factors in the use of semiconductor amplifiers is the low frequency at which $\alpha$ reaches a value of approximately 0.707 known as the $\alpha$ cut-off point. There are two reasons why the $\alpha$ cut-off point of the arrangement of Figure 4 occurs at a higher frequency and why the slope of the decrease in $\alpha$ with frequency beyond this point is relatively low. As explained above, the operating point can be set to give a maximum current gain at a minimum value of $r_b$ and, for reasons known well to those skilled in the art, the lower the value of $r_b$ at the operating point, the greater is the frequency at which the $\alpha$ cut-off point occurs. This is a major factor and can easily be attained when a fused dot type of semiconductor is used. Another contributing factor is that the maximum current transfer ($\alpha$ a maximum) takes place when the area of emission at the surface of the emitter 54 and hence the effective area of the collector is very small so that the collector capacity is reduced at the operating point by a substantial amount. The $\alpha$ versus frequency characteristic is illustrated by the curve 57 of Figure 7.

Figure 8:
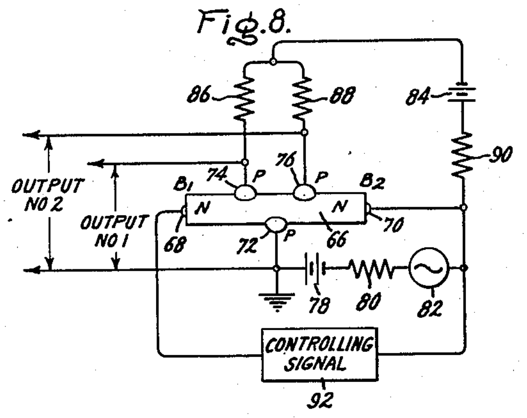
Figure 8 illustrates a semiconductor apparatus wherein a signal applied to an emitter may be switched to a selected one of a plurality of collectors by application of suitable potentials between the base electrodes.
Figure 9:
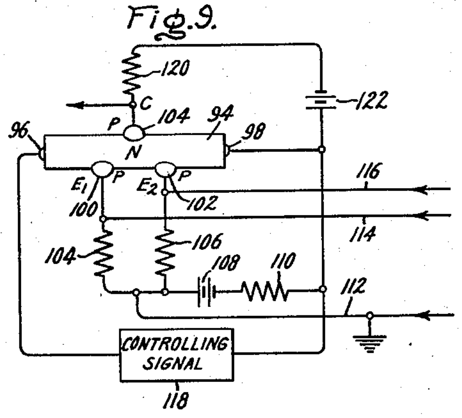
Figure 9 illustrates a semiconductor apparatus wherein an input signal is applied to each of a plurality of emitters and wherein a selected input signal appears in amplified form at a single collector, the particular signal selected being determined by the voltages applied between two base electrodes.

The principle of using a transverse field may also be applied to a semiconductor device so as to switch the flow of carriers from an emitter to a selected one of a plurality of collectors as illustrated in Figure 8, or it may be applied so as to direct the carriers from one or another of a plurality of emitters to a given collector as illustrated in Figure 9. The semiconductor device of Figure 8 is comprised of a body 66 of N-type semiconductor material, two oppositely disposed base-electrodes 68 and 70, a collector 74 that is closer to the base electrode 68 than an emitter 72 and a collector 76 that is closer to the base electrode 70 then the emitter 72. A battery 78 or other suitable source of E.M.F. is connected in series or may be used with a potentiometer with a resistor 80, and a source of input signal 82 is connected between the grounded emitter 72 and the base electrode 70. The battery 78 is polarized so as to make the emitter positive with respect to the base electrode as is customary for a P–N–P semiconductor device. The resistor 80 is large in comparison with the resistance between the emitter 72 and the base electrode 70 so that variation in the resistance between the emitter and the base will not appreciably effect the total current of emitted carriers. It should be borne in mind that extremely small fractional changes in the D.C. emitter current can change the power gain by a considerable amount. The signal supplied by the source 82 is, however, capable of producing large corresponding power variations in the load resistors 86 or 88 as the case may be. Such power gain will be in accordance with principles well known to those skilled in the art. The collectors 74 and 76 are individually coupled to the negative terminal of a suitable source of fixed potential, here shown as a battery 84, via load resistors 86 and 88 respectively. The positive terminal of the battery 84 is coupled to the base electrode 70 via a resistor 90. A transverse electrostatic field is established in base material 66 by applying suitable potentials from a source of control signals 92 between the base electrodes 68 and 70.

Figure 10:
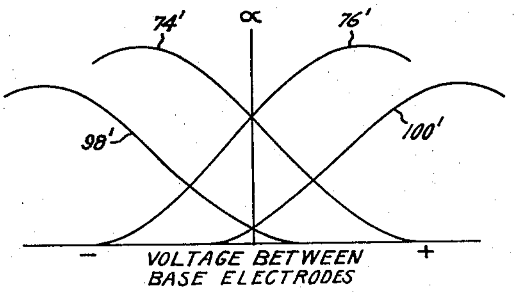
Figure 10 is a graph illustrating operating characteristics of the semiconductor device of Figures 8 and 12.

The operation of the arrangement of Figure 8 is as follows. Most of the carriers emitted from the left side of the base electrode 72 proceed to the collector 74 whereas the carriers emitted from the right side of the collector go to the collector 76. For reasons discussed above in conjunction with Figures 1 and 4, an increasing voltage in a positive direction applied to the base electrode 68 causes an increasing area of low-conduction to spread from the left side of the emitter 72 toward the right side so that the change in the fraction of the total current reaching the collector 76 produces an $\alpha$ characteristic as shown by the graph 76′ of Figure 10. Conversely, the $\alpha$ characteristic of the collector 74 is as indicated by the graph 74′ of the same figure. Examination of these characteristics shows that at one value of the control voltage, most of the emitted carriers flow to the collector 74 so as to develop an amplified output signal corresponding to the input signal across the load resistor 86. At a more positive value of the control voltage most of the emitter current flows to the collector 76 so as to produce an amplified output signal across the load resistor 88. As illustrated in Figure 10, the characteristics intersect when the interbase voltage is zero, but variations in the relative positions of the emitter and collector electrodes can cause the intersection to shift either left or right.

In Figure 9, an arrangement is shown wherein either of two separate input signals can be selectively applied to a single output circuit. The semiconductor device is comprised of a body 94 of N-type semiconductor material, two oppositely disposed base electrodes 96 and 98, two emitter electrodes 100 and 102 of the P-type and a P-type collector 104. The emitters 100 and 102 are coupled by input resistors 104 and 106 respectively to the positive terminal of a suitable source of E.M.F. such as a battery 108. The negative terminal of the battery may be coupled via a resistor 110 to the base electrode 98, the resistor 110 being large in comparison with the resistance between either of the emitter electrodes 100 and 102 and the base electrodes so as to cause the emitter to emit a constant number of carriers per unit time in the quiescent state. One input signal is applied between a lead 116 that is connected to the emitter 102 and a grounded lead 112. A controlling signal applied by a source 118 is connected between the base electrodes 96 and 98 so as to set up a transverse electrostatic field that can cause the carriers from one or the other of the emitters 100 and 102 to reach the collector 104. The collector 104 is coupled via a load resistor 120 to the negative terminal of a source of E.M.F., here shown as a battery 122, and the positive terminal of the battery is connected to the base electrode 98 so as to secure proper biasing. The amplified output signal corresponding to one or the other of the input signals thus appears across the load resistor 120.

It will be readily apparent in view of the foregoing discussion that more emitters and/or collectors can be provided so that the same transverse field can selectively control the flow of carriers in a desired manner.

To those skilled in the art it will be apparent that there are other ways of incorporating the four electrode semiconductor device, that is a feature of this invention, into an operative circuit. As shown in Figures 1, 2, 3 and 4, one of the bases is grounded but the emitter or collector could be grounded without changing the principles of operation of the invention.

Except in the case where the apparatus of Figure 1 was to be used as a modulator, the previous discussion of the operational characteristics of the semiconductor apparatus of this invention has assumed that the operating point was maintained by suitable variation in the voltages supplied by the batteries 3 and 5. Under these conditions, for reasons previously discussed, a variation in the interbase voltage produces a change in the current gain $\alpha$ and hence in the power gain. Even if the operating point is maintained by adjusting the circuit parameters in such manner as to maintain a constant emitter current and a constant collector voltage, the power gain is further varied because of changes in the resistance of the body 6. These latter effects are generally less than the effect of the change in the current gain $\alpha$.

Figure 11:
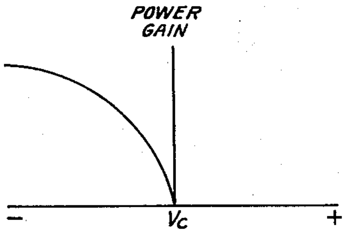
Figure 11 is a curve of the A.C. power gain of semiconductor devices plotted against the collector voltage.

Consider now the effect of the inter-base voltage on the operating characteristics of the semiconductor device of Figure 1 if no attempt is made to maintain a constant operating point. Assume, for example, that the voltage applied to the base electrode 10 of Figure 1 is negative with respect to the reference potential, shown as ground, applied to the base electrode 8. The total number of carriers injected into the body 6 by the emitter 2 is increased owing to the greater voltage now existing across the junction between the emitter 2 and the body 6. The fractional number of this increased number of carriers that reach the collector 4 depends on the effect on the inter-base voltage on the current gain $\alpha$. With the electrode configuration of Figure 1, the reduction of $\alpha$, as illustrated by curves such as 20 of Figure 5, may be small enough so that the net result is an increase in the actual number of carriers reaching the collector. Since the semiconductor device of Figure 1 is of the P–N–P type, the carriers are principally holes, so that the electron flow in the load resistor 23 is such as to make the top of the resistor more positive. An IR drop of the polarity makes the net voltage $V_c$ applied to the collector 4 less negative. As can be seen from the graph of Figure 11, the A.C. power gain of the apparatus is reduced under these conditions. If the potential applied to the base electrode 10 is positive, fewer carriers are emitted, and any reduction in $\alpha$ further decreases the number of carriers reaching the collector so that the collector voltage $V_c$ becomes more negative, the net result being that the power gain of the apparatus is increased. Hence it can be seen that when the operating point is permitted to vary, that the inter-base voltage may have even greater effect on the power gain of the apparatus.

Figure 6:
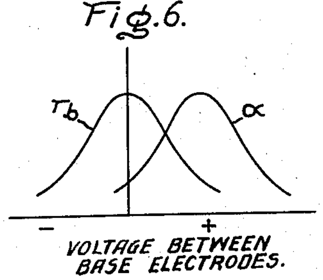
Figure 6 is a graph illustrating the changes in $R_b$ and $\alpha$ obtained for different values of the voltage between the base electrodes of Figure 4.

The preceding discussion related to the effect of the inter-base voltage on the power gain of the semi-conductor apparatus of Figure 1 under the condition that the operating point be permitted to vary, but the consideration of the same factors shows that the inter-base voltage has a marked effect on the power gain of semiconductor devices having other electrode configuration. For example, the apparatus of Figure 4 attains a maximum $\alpha$ when a given positive potential is applied to the base electrode 56, as is shown by Figure 6. If this potential is increased, $\alpha$ decreases, the total emitter current decreases, it being assumed that semiconductor device of Figure 4 is of the P–N–P type, and therefore, the A.C. power gain is decreased by a greater amount than is indicated by the change in $\alpha$.

In previous discussions it has been assumed that the input signal could be applied to either the emitter or in series with one of the base electrodes. However, it could also be applied across a resistor connected between the base electrode 8 and ground.

Figure 12:
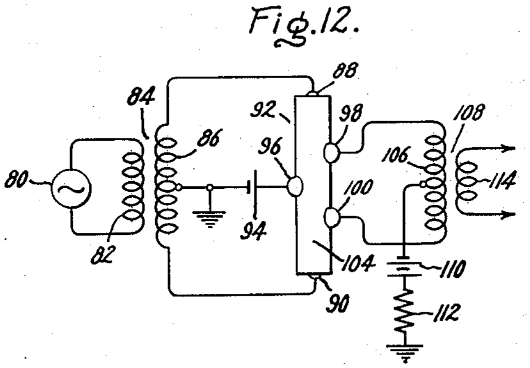
Figure 12 illustrates a semiconductor apparatus that operates as a push-pull amplifier.

Figure 12 illustrates how a semiconductor device employing the principles of this invention may be used as a push-pull amplifier. A source 80 of input signals is connected across the primary 82 of a transformer 84. The opposite ends of the secondary 86 are connected to the base electrodes 88 and 90 and its center tap is grounded so as to provide means for setting up a transverse field in the semiconductor device 92 that varies in polarity and magnitude in accordance with the input signal. If the semiconductor device 92 is of the P–N–P type, a source 94 of E.M.F. is inserted between ground and an emitter 96 in such manner as to make the emitter positive in accordance with normal practice. Two collectors 98 and 100 are mounted on the side of the body 104 of the semiconductor device 92 and are so located that when the inter-base voltage is zero, which condition exists as the input signal goes through its axis, little or no carriers reach either of the collectors 98 and 100. The variation in $\alpha$ produced for the carrier path between the emitter 96 and the collector 98, when the inter-base voltage refers to the voltage of the base electrode 88 is illustrated by the curve 98′ of Figure 10 and the $\alpha$ characteristic for the path to the collector 100 is indicated by the curve 100′. The opposite ends of a primary coil 106 of an output transformer 108 are connected to the collectors 98 and 100 respectively and source of E.M.F. such as a battery 110 and a resistor 112 are connected in series between a point of reference potential, here shown as ground, and an intermediate point of the primary 106 so as to bias the collectors negatively in accordance with accepted practice. As the input signal swings from its axis in a positive direction during the first quarter of a cycle, the potential of base electrode 88 may increase in a similar manner for a given winding polarity of the primary 82 and the secondary 86 of the input transformer 84. This would cause the carriers, for reasons discussed previously, to flow to the emitter 100 in increasing numbers. This in turn causes the electrons to flow downward through the lower half of the primary 106 of the output transformer 106. During the next quarter cycle the number of carriers flowing to the collector 100 is reduced in accordance with the input signal. During the third quarter cycle the carriers flow to the collector 98 in increasing amounts so as to cause electrons to flow upward in the upper half of the primary 106 of the output transformer 108. During the last quarter cycle the carriers flowing to the collector 98 decrease and the flow of electrons in the upper half of the primary decreases until the signal again passes through its axis at which point few, if any, carriers flow to either collector. The process is then repeated. Under these conditions the input signal will appear in amplified form across the output terminals of the secondary 114 of the output transformer 108.

While certain specific embodiments have been shown and described, it will be understood that various modifications may be made without departing from the inventive concept.

What I claim as new and desire to secure by Letters Patent of the United States is:

1. A semiconductor device comprising in combination a body of semiconductor material of one carrier type having a pair of opposed surfaces, an emitter mounted on one of said surfaces to form a junction of a predetermined area therewith, a collector mounted on the other of said surfaces to form a junction of a predetermined area therewith separated from said emitter junction by a distance sufficiently small to permit an appreciable number of carriers injected across said emitter junction to reach said collector junction by diffusion, at least a portion of said emitter and collector junction being directly opposite each other, and means independent of said emitter and collector for establishing different electrostatic potentials at different points of said body adjacent to said emitter in response to suitably applied voltages.

2. A semiconductor device comprising in combination a body of semiconductor material of one carrier type having a pair of opposed sides, an emitter mounted at one of said sides to form a junction of a predetermined area therewith, a collector mounted on the other of said sides to form a junction of a predetermined area therewith substantially parallel to said emitter junction and separated therefrom by a distance sufficiently small to permit an appreciable number of carriers injected across said emitter junction to reach said collector junction by diffusion, at least a portion of said emitter and collector junction overlapping the same part of said body, and means exclusive of said emitter or collector for establishing different electrostatic potentials at different points of said body adjacent to said emitter in response to suitably applied voltages.

3. A semiconductor device comprising in combination a body of semiconductive material having therein a first and a second zone of one conductivity type and a third zone of opposite conductivity type between said first and second zones and forming a first junction with the first zone and a second junction with the second zone, said body having a pair of substantially mutually perpendicular axes, said first and second zones having portions lying on one of said axes of said body, an emitter contact to said first zone, a collector contact to the second zone, a first base contact to one part of the third zone, a separate auxiliary base contact to another part of the third zone, said first base contact and said auxiliary base contact lying on the other of said axes.

4. A semiconductor device comprising a body of semiconductive material having therein a first and a second zone of one conductivity type and a third zone of opposite conductivity type between said first and second zones and forming a first junction with the first zone and a second junction with the second zone, an emitter contact to said first zone, a collector contact to said second zone, and a pair of electrodes mounted on opposite sides of said third zone, said electrodes lying in a line which is substantially perpendicular to a line which passes through both of said junctions.

5. A semiconductor device comprising in combination a body of semiconductive material having therein a first and a second zone of one conductivity type and a third zone of opposite conductivity type between said first and second zones and forming a first junction with the first zone and a second junction with the second zone, said body having a pair of substantially mutually perpendicular axes, said first and second zones having portions lying on one of said axes of the body, an emitter terminal contacting said first zone, a collector terminal connecting said second zone, a first base terminal contacting one part of said third zone, a separate auxiliary base terminal contacting another part of said third zone, said first base terminal and said auxiliary base terminal lying on the other of said axes, the separation of said first and second junctions being selected sufficiently small to permit a substantial number of carriers injected across said first junction into said third zone to diffuse to said second junction in the absence of any appreciable fields in said third zone caused by application of potentials to said base electrodes.

6. A semiconductor device consisting of a body of semiconductor material having one type of conduction carrier predominating, a first and second quantity of semiconductor material having the opposite type conduction carriers predominating, each of said first and second quantities being mounted at different points of said body and in such intimate contact as to form first and second rectifying junctions, said second rectifying junction being sufficiently close to said first rectifying junction to collect a substantial number of conduction carriers injected across said first junction into said body in the absence of any appreciable fields in said body, an emitter contact to said first quantity of semiconductor material, a collector contact to said second quantity of semiconductor material, and a pair of electrodes mounted on opposite sides of said body having one type conduction carriers predominating, said electrodes lying on a line which is substantially perpendicular to a line which is normal to both of said junctions.

7. A semiconductor device comprising in combination a body of semiconductor material of one carrier type having a pair of opposed sides, an emitter mounted at one of said sides to form a junction of a predetermined area therewith, a collector mounted on the other of said sides to form a junction of a predetermined area therewith, separated from said emitter junction by a distance sufficiently small to permit an appreciable number of carriers injected across said emitter junction to reach said collector junction, at least a portion of said emitter and collector junction being directly opposite each other, two electrodes mounted on said body, a line drawn between said electrodes being substantially perpendicular to a line drawn between said junctions which is normal to both of said junctions.

8. A semiconductor device comprising in combination a body of semiconductor material of one carrier type having a pair of opposed sides, an emitter mounted at one of said sides to form a junction of a predetermined area therewith, a collector mounted on the other of said sides to form a junction of a predetermined area therewith, separated from said emitter junction by a distance sufficiently small to permit an appreciable number of carriers injected across said emitter junction to reach said collector junction, the area of the junction formed by said emitter being smaller than the area of the junction formed by said collector, at least a portion of said emitter and collector junction being directly opposite each other, two electrodes mounted on said body, a line drawn between said electrodes being substantially perpendicular to a line drawn between said junctions which is normal to both of said junctions.

9. A semiconductor device comprising in combination a body of semiconductor material of one carrier type having a pair of opposed sides, an emitter mounted at one of said sides to form a junction of a predetermined area therewith, a collector mounted on the other of said sides to form a junction of a predetermined area therewith separated from said emitter junction by a distance sufficiently small to permit an appreciable number of carriers injected across said emitter junction to reach said collector junction, the area of the junction formed by said emitter is larger than the area of the junction formed by said collector, at least a portion of said emitter and collector junctions being directly opposite each other, two electrodes mounted on said body, a line drawn between said electrodes being substantially perpendicular to a line drawn between said junctions which is normal to both of said junctions.

10. A semiconductor device comprising in combination a body of semiconductor material of one carrier type having a pair of opposed sides, an emitter mounted at one of said sides to form a junction of a predetermined area therewith, a collector mounted on the other of said sides to form a junction of a predetermined area therewith separated from said emitter junction by a distance sufficiently small to permit an appreciable number of carriers injected across said emitter junction to reach said collector junction, at least a portion of said emitter and collector junction being directly opposite each other, two electrodes mounted on said body, a line drawn between said electrodes being substantially perpendicular to a line drawn between said junction which is normal to both of said junctions, said emitter and collector junctions being dissimilarly located with repect to said electrodes.

11. A semiconductor device comprising in combination a body of semiconductor material of one carrier type, a first and second quantity of semiconductor material of a different carrier type, each of said first and second quantities forming a respective rectifying junction with said body, said junctions being arranged in opposed relationship and separated by a distance sufficiently small to allow an appreciable number of carriers injected across said first junction into said body to reach the other junction, and means separate from said first and second quantities of semiconductor material for establishing an electric potential gradient that is substantially perpendicular to the mean path of carrier flow between said first and second quantities of semiconductor material.

12. A semiconductor device comprising in combination a body of semiconductor material of one carrier type, a first and second quantity of semiconductor material of a different type, each of said first and second quantities forming a respective rectifying junction with said body, said junctions being arranged in opposed relationship and separated by a distance sufficiently small to allow an appreciable number of carriers injected across said first junction into said body to reach the other junction, and means for establishing an electrostatic field in said body comprising two electrodes mounted on opposite sides of said body on a line drawn between them which is substantially perpendicular to the normals to the junctions formed by said first and second quantities of semiconductor material, a normal to one junction being collinear with corresponding normal to the other junction.

13. A semiconductor device comprising in combination a body of semiconductor material of one carrier type, a first and second quantity of semiconductor material of a different type, each of said first and second quantities forming a respective rectifying junction with said body, said junctions being arranged in opposed relationship and separated by a distance sufficiently small to allow an appreciable number of carriers injected across said first junction into said body to reach the other junction, and means for establishing a potential gradient in said body comprising two electrodes mounted on opposite sides of said body on a line drawn between them which is substantially perpendicular to the normals to the junctions formed by said first and second quantities of semiconductor material, a normal to one junction being collinear with a corresponding normal to the other junction, said first quantity of semiconductor material being mounted nearer one of said electrodes than said second quantity of semiconductor material and said second quantity of semiconductor material being mounted nearer the other of said electrodes.

14. A semiconductor device comprising in combination a body of semiconductor material of one carrier type having a pair of opposed surfaces, an emitter mounted on one of said surfaces to form a junction of predetermined area therewith, a pair of collectors mounted on the other of said surfaces to form junctions of predetermined area therewith, each of said collector junctions separated from said emitter junction by a distance sufficiently small to permit an appreciable number of carriers injected across said emitter junction to reach each of said collector junctions by diffusion, at least a portion of said emitter junction being directly opposite each of said collector junctions, and means independent of said emitter and collector junctions for establishing different electrostatic potentials at different points of said body adjacent to said emitter in response to suitably applied voltages.

15. A semiconductor device comprising in combination a body of semiconductor material of one carrier type having a pair of opposed sides, a pair of emitters mounted on one of said sides to form a pair of junctions of predetermined area therewith, a collector mounted on the other of said sides to form a junction of predetermined area therewith substantially parallel to each of said emitter regions and separated therefrom by a distance sufficiently small to permit an appreciable number of carriers injected across said emitter junctions to reach said collector junction by diffusion, at least a portion of said collector junctions overlapping the same part of said body as a respective one of said emitter junctions, and means exclusive of said emitter or collector for establishing different electrostatic potentials at different points on said body adjacent to said emitter in response to suitably applied voltages.

16. In combination, a body of semiconductor material of one carrier type having a pair of opposed surfaces, an emitter mounted on one of said surfaces to form a junction of predetermined area therewith, a collector mounted on the other of said surfaces to form a junction of predetermined area therewith separated from said emitter junction by a distance sufficiently small to permit an appreciable number of carriers injected across said emitter junction to reach said collector region by diffusion, at least a portion of said emitter and collector junctions being directly opposite each other, means for making contact to said body, said emitter and said collector, means for interconnecting the contact means including a source of voltage, a signal source and circuit elements to produce a flow of current from said emitter to said collector, and means independent of said emitter or collector for establishing different electrostatic potentials at different points on said body adjacent to said emitter in response to suitably applied voltages for varying the current flow from said emitter to said collector.

17. In combination, a body of semiconductor material of one carrier type having a pair of opposed surfaces, an emitter mounted on one of said surfaces to form a junction of predetermined area therewith, a pair of collectors mounted on the other of said surfaces to form junctions of predetermined area therewith, each of said collector junctions separated from said emitter junction by a distance sufficiently small to permit an appreciable number of carriers injected across said emitter junction to reach each of said collector junctions by diffusion, at least a portion of said emitter junction being directly opposite each of said collector junctions, means for making contact to said emitter, said collectors and said body, means for interconnecting the contact means including source of voltage, a signal source, and circuit elements to cause a flow of current from said emitter to said collectors, means independent of said emitter or collector for establishing different electrostatic potentials at different points on said body adjacent to said emitter in response to suitably applied voltages for varying current flow from said emitter to said collectors.

18. In combination, a body of semiconductor material of one carrier type having a pair of opposed sides, a pair of emitters mounted on one of said sides to form junctions of predetermined area therewith, a collector mounted on the other of said surfaces to form a junction of predetermined area therewith, said collector separated from said emitter junctions by a distance sufficiently small to permit an appreciable number of carriers injected across said emitter junctions to reach said collector junction by diffusion, at least a portion of said collector junction being directly opposite a respective portion of each of said emitter junctions, a pair of contacts for establishing different electrostatic potentials at different points of said body adjacent to said emitters in response to suitably applied voltages, means for interconnecting said contacts with said emitters and collectors including a source of voltage and circuit elements for producing current flow from said emitters to said collector, signal means connected to said pair of contacts for varying the current flow from said emitters to said collector.

19. In combination, a body of semiconductor material of one carrier type having a pair of opposed surfaces, an emitter mounted on one of said surfaces to form a junction of predetermined area therewith, a pair of collectors mounted on the other of said surfaces to form a junction of predetermined area therewith, each of said collectors separated from said emitter junction by a distance sufficiently small to permit an appreciable number of carriers injected across said emitter junction to reach each of said collector junctions by diffusion, at least a portion of said emitter junction being directly opposite a respective portion of each of said collector junctions, a pair of contacts for establishing different electrostatic potentials at different points of said body adjacent to said emitter in response to suitably applied voltages, means for applying signals between said emitter and each of said contacts for producing current flow from said emitter to said collector, means for deriving an output current between each of said collectors and a respective contact of said pair of contacts.

References Cited in the file of this patent

UNITED STATES PATENTS

| | | |
|---|---|---|
| 2,522,521 | Kock | Sept. 19, 1950 |
| 2,524,035 | Bardeen | Oct. 3, 1950 |
| 2,553,490 | Wallace | May 15, 1951 |
| 2,553,491 | Shockley | May 15, 1951 |
| 2,569,347 | Shockley | Sept. 25, 1951 |
| 2,600,500 | Haynes et al. | June 17, 1952 |
| 2,657,360 | Wallace | Oct. 27, 1953 |
| 2,666,814 | Shockley | Jan. 19, 1954 |
| 2,695,930 | Wallace | Nov. 30, 1954 |
| 2,756,285 | Shockley | July 24, 1956 |

Notice of Adverse Decision in Interference

In Interference No. 91,365 involving Patent No. 2,901,554, I. A. Lesk, SEMICONDUCTOR, DEVICE AND APPARATUS, final judgment adverse to the patentee was rendered Feb. 28, 1962, as to claims 14, 17 and 19.

[*Official Gazette March 30, 1965.*]